United States Patent
Kim et al.

(10) Patent No.: US 8,189,400 B2
(45) Date of Patent: May 29, 2012

(54) DATA ALIGNMENT CIRCUIT OF SEMICONDUCTOR MEMORY APPARATUS

(75) Inventors: Hyung Soo Kim, Gyeonggi-do (KR); Yong Ju Kim, Gyeonggi-do (KR); Sung Woo Han, Gyeonggi-do (KR); Hee Woong Song, Gyeonggi-do (KR); Ic Su Oh, Gyeonggi-do (KR); Tae Jin Hwang, Gyeonggi-do (KR); Hae Rang Choi, Gyeonggi-do (KR); Ji Wang Lee, Gyeonggi-do (KR); Jae Min Jang, Gyeonggi-do (KR); Chang Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 299 days.

(21) Appl. No.: 12/647,174

(22) Filed: Dec. 24, 2009

(65) Prior Publication Data
US 2010/0309732 A1    Dec. 9, 2010

(30) Foreign Application Priority Data

Jun. 9, 2009    (KR) .................... 10-2009-0050797

(51) Int. Cl.
*G11C 7/00* (2006.01)
(52) U.S. Cl. .................. 365/189.02; 365/189.17
(58) Field of Classification Search ............. 365/189.02, 365/189.17
See application file for complete search history.

(56) References Cited

U.S. PATENT DOCUMENTS

| 5,260,781 A | 11/1993 | Soloff et al. |
| 5,831,929 A | 11/1998 | Manning |
| 5,953,278 A | 9/1999 | McAdams et al. |
| 6,950,370 B2 * | 9/2005 | Lee .......................... 365/233.13 |
| 6,987,704 B2 * | 1/2006 | Park ......................... 365/185.17 |
| 2009/0231933 A1 * | 9/2009 | Hur et al. ................. 365/189.12 |

FOREIGN PATENT DOCUMENTS

| JP | 11-328963 A | 11/1999 |
| JP | 2000-149554 A | 5/2000 |
| KR | 1020040059958 A | 7/2004 |
| KR | 100772695 B1 | 10/2007 |

* cited by examiner

*Primary Examiner* — Hoai V Ho
*Assistant Examiner* — Anthan Tran
(74) *Attorney, Agent, or Firm* — Ladas & Parry LLP

(57) ABSTRACT

A data alignment circuit of a semiconductor memory apparatus for receiving and aligning parallel data group includes a first control unit, a second control unit, a first alignment unit and a second alignment unit. The first alignment unit generates a first control signal group in response to an address group, a clock signal, and a latency signal. The second control unit generates a second control signal group in response to the address group, the clock signal, and the latency signal. The first alignment unit aligns the parallel data group as a first serial data group in response to the first control signal group. The second alignment unit aligns the parallel data group as a second serial data group in response to the second control signal group.

17 Claims, 5 Drawing Sheets

100

DATA ALIGNMENT CIRCUIT OF SEMICONDUCTOR MEMORY APPARATUS

CROSS-REFERENCES TO RELATED APPLICATION

The present application claims priority under 35 U.S.C 119(a) to Korean Application No. 10-2009-0050797, filed on Jun. 9, 2009, in the Korean Patent Office, which is incorporated herein by reference in its entirety as if set forth in full.

BACKGROUND

1. Technical Field

Embodiments described herein relate generally to a semiconductor memory apparatus, and more particularly, to a data alignment circuit of a semiconductor memory apparatus.

2. Related Art

A conventional semiconductor memory apparatus transmits and receives plural bits of data to and from an external memory control apparatus in series. Further, the internal components of a semiconductor memory apparatus include a plurality of global data buses (GIOs) for transmitting or outputting the plural bits of data to or from a core area. The plural bits of data are transmitted in parallel through the global data buses. As such, the plural bits of data are transmitted in parallel when inside the semiconductor memory apparatus but are transmitted in series when outside the semiconductor memory apparatus. The differing internal and external transmission methods require a data input area with a circuit for aligning serial data in parallel and a data output area with a circuit for aligning parallel data in series. For this, the semiconductor memory apparatus includes a data alignment circuit in each of the data input area and the data output area.

The data alignment circuit of the semiconductor memory apparatus generates a plurality of control signals in response to the input of plural bits of an address. The data alignment circuit modifies the order of alignment of received data in accordance with timings at which the control signals are enabled. To this end, the data alignment circuit of the semiconductor memory apparatus includes a control signal generator and a data alignment unit. The control signal generator performs an operation of generating the plurality of control signals from the plural bits of the address.

FIG. 1 is a schematic configuration diagram of a control signal generator 100 of the data alignment circuit of a semiconductor memory apparatus.

Referring to FIG. 1, the control signal generator 100 of the data alignment circuit of the semiconductor memory apparatus includes two flip-flops FFA and FFB that operate by a clock signal 'CLK' and a combinational logic circuit 1 therebetween that generates a control signal 'CTRL' derived from an address ADD.

The desire to achieve the highest possible operation speed of a semiconductor memory apparatus has in turn led to an increase in the frequency of the clock signal 'CLK'. Referring to the configuration of the control signal generator 100 shown in FIG. 1, since the combinational logic circuit 1 is disposed between the two flip-flops FFA and FFB, the combination logic circuit 1 should complete operations within a prescribed time. However, the clock signal's 'CLK' high frequency restricts the operable time of the combinational logic circuit 1. Although a detailed internal configuration is not shown, the combinational logic circuit 1 is generally configured in a manner in which a signal path advances through 7 to 11 transistors. This signal path imposes a limit on improvement of the operation speed of the combinational logic circuit 1. Consequently, it is difficult for the control signal generator 100 to perform high-speed operation.

Accordingly, high-speed operation of a semiconductor memory apparatus requires both internal components suitable for implementing high-speed operation and a data alignment circuit configured to operate using a high-frequency clock signal. However, as described above, the configuration of a typical data alignment circuit limits the ability to shorten the operation time required to generate the control signal making it difficult for the data alignment circuit to appropriately implement high-speed operation. Consequently, the data alignment circuit of the semiconductor memory apparatus that can implement the high-speed operation should be implemented by performing a normal operation when the high-frequency clock signal is inputted.

SUMMARY

In an embodiment of the present invention, a data alignment circuit of a semiconductor memory apparatus includes: a first control unit configured to generate a first control signal group in response to an address group, a clock signal, and a latency signal; a second control unit configured to generate a second control signal group in response to the address group, the clock signal, and the latency signal; a first alignment unit configured to align a parallel data group as a first serial data group in response to the first control signal group; and a second alignment unit configured to align the parallel data group as a second serial data group in response to the second control signal group.

In another embodiment of the present invention, a data alignment circuit of a semiconductor memory apparatus includes: a first multiplexing unit configured to 2:1-multiplex a parallel data group in response to a first control signal generated by dividing a clock signal by 1 and latching a first address by using the divided clock signal; a second multiplexing unit configured to 2:1-multiplex the data group outputted from the first multiplexing unit in response to a second control signal generated by dividing the clock signal by 2 and latching a second address by using the divided clock signal; a third multiplexing unit configured to 2:1-multiplex the data group outputted from the second multiplexing unit in response to a third control signal generated by dividing the clock signal by 4 and latching a third address by using the divided clock signal; and a fourth multiplexing unit configured to output a serial data group by 2:1-multiplexing the data group outputted from the third multiplexing unit in response to the clock signal.

In still another embodiment of the present invention, a data alignment circuit of a semiconductor memory apparatus includes: a controller configured to generate a first control signal group and a second control signal group in response to an address group, a clock signal, and a latency signal, wherein the controller is configured to change a state of the second control signal group in response to an alignment type signal; a first alignment unit configured to align a parallel data group as a first serial data group in response to the first control signal group; a second alignment unit configured to align the parallel data group as a second serial data group in response to the second control signal group; and a data combination unit configured to output a third serial data group by combining the second serial data group with the first serial data group in response to the clock signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
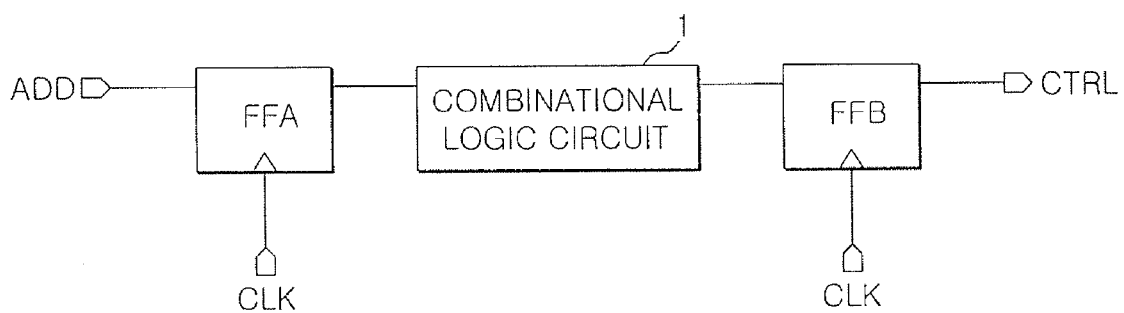
FIG. 1 is a schematic configuration diagram of a control signal generator of a data alignment circuit of a semiconductor memory apparatus.
Figure 2:
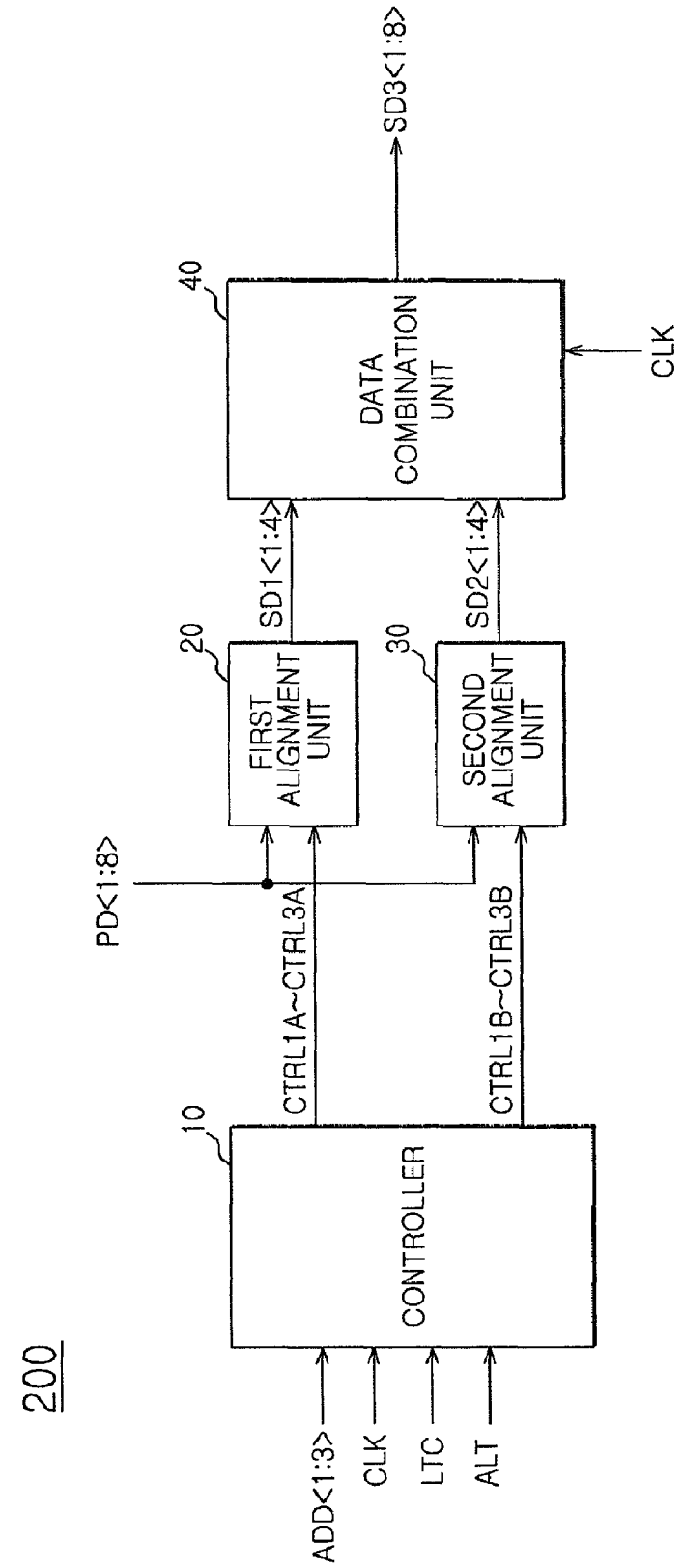
FIG. 2 is a block diagram showing a configuration of an exemplary data alignment circuit of a semiconductor memory apparatus according to an embodiment of the present invention.

FIG. 2 is a block diagram showing a configuration of an exemplary data alignment circuit 200 of a semiconductor memory apparatus according to an embodiment of the present invention.

In FIG. 2, an embodiment of the data alignment circuit 200 of the semiconductor memory apparatus is configured to include a controller 10, a first alignment unit 20, a second alignment unit 30, and a data combination unit 40.

The controller 10 generates a first control signal group CTRL1A to CTRL3A and a second control signal group CTRL1B to CTRL3B in response to an address group 'ADD<1:3>', a clock signal 'CLK', a latency signal 'LTC', and an alignment type signal 'ALT'. The first alignment unit 20 is responsive to the first control signal group 'CTRL1A' to 'CTRL3A' to align a parallel data group 'PD<1:8>' in a manner in which a first serial data group 'SD1<1:4>' is output. The second alignment unit 30 is responsive to the second control signal group 'CTRL1B' to 'CTRL3B' to align the parallel data group 'PD<1:8>' in a manner in which a second serial data group 'SD2<1:4>' is output. The data combination unit 40 outputs a third serial data group 'SD3<1:8>' by combining the second serial data group 'SD2<1:4>' with the first serial data group 'SD1<1:4>' in response to the clock signal 'CLK'.

The controller 10 can change the state of the second control signal group 'CTRL1B' to 'CTRL3B' in response to the alignment type signal 'ALT'. That is, the controller 10 can control the state of the second control signal group 'CTRL1B' to 'CTRL3B' in accordance with an instruction of the alignment type signal 'ALT', whereby the order of the combined data of the third serial data group 'SD3<1:8>' outputted from the data combination unit 40 can be modified according to the instruction of the alignment type signal 'ALT'.

Herein, the latency signal 'LTC' is a signal inputted from outside of the semiconductor memory apparatus and defines the timing at which the address group 'ADD<1:3>' is inputted into the controller 10.

When the latency signal 'LTC' is inputted, the controller 10 divides the clock signal 'CLK' by 1, 2, and 4 (whereby an enable period is 1 clock cycle, 2 clock cycles, and 4 clock cycles respectively). The controller uses the clock signals divided by 1, 2, and 4 to latch the first address 'ADD<1>', the second address 'ADD<2>', and the third address 'ADD<3>' of the address group 'ADD<1:3>' respectively, to thus generate the first control signal group 'CTRL1A' to 'CTRL3A'. Further, when the latency signal 'LTC' is inputted, the controller 10 divides the clock signal 'CLK' by 1, 2, and 4 and latches the first address 'ADD<1>' of the address group 'ADD<1:3>'; a signal generated by combining the second address 'ADD<2>' and the first address 'ADD<1>' with the alignment type signal 'ALT'; and the third address 'ADD<3>', respectively, to thus generate the second control signal group 'CTRL1B' to 'CTRL3B'.

In an embodiment, the first alignment unit 20 performs a 2:1 multiplexing operation on the parallel data group 'PD<1:8>' three times in response to the first control signal group 'CTRL1A' to 'CTRL3A'. As a result, the first alignment unit 20 generates the four bits of data of the first serial data group 'SD1<1:4>'.

Likewise, an embodiment of the second alignment unit 30 performs a 2:1 multiplexing operation on the parallel data group 'PD<1:8>' three times in response to the second control signal group 'CTRL1B' to 'CTRL3B'. As a result, the second alignment unit 30 generates the four bits of data of the second serial data group 'SD2<1:4>'.

Thereafter, the data combination unit 40 combines the second serial data group 'SD2<1:4>' with the first serial data group 'SD1<1:4>' in response to the clock signal 'CLK' and performs an operation of alternately outputting data bits of the first serial data group 'SD1<1:4>' bit by bit and the second serial data group 'SD2<1:4>' at each of a rising edge and a falling edge of the clock signal 'CLK'. As a result, in the third serial data group 'SD3<1:8>', the data bits of the first serial data group 'SD1<1:4>' and the second serial data group 'SD2<1:4>' are alternatively combined with each other.

As described above, the data alignment circuit 200 of the semiconductor memory apparatus according to an embodiment divides the clock signal 'CLK' at plural division ratios to generate the first control signal group 'CTRL1A' to 'CTRL3A' by latching the address group 'ADD<1:3>' using the divided clock signals. In addition, the data alignment circuit 200 generates the first serial data group 'SD1<1:4>' by performing a 2:1 multiplexing operation on the parallel data group 'PD<1:8>' at plural timings by using the first control signal group 'CTRL1A' to 'CTRL3A'. Further, the data alignment circuit 200 latches each of the address group 'ADD<1:3>' by using the divided clock signals to generate the second control signal group 'CTRL1B' to 'CTRL3B'. The data alignment circuit 200 adjusts the state of the second control signal group 'CTRL1B' to 'CTRL3B' using the alignment type signal 'ALT' and performs the 2:1 multiplexing operation of the parallel data group 'PD<1:8>' at plural timings by using the second control signal group 'CTRL1B' to 'CTRL3B' to generate the second serial data group 'SD2<1:4>'. Thereafter, an embodiment of the data alignment circuit 200 generates the third serial data group 'SD3<1:8>' by combining the second serial data group 'SD2<1:4>' with the first serial data group 'SD1<1:4>' in response to the clock signal 'CLK'.

The data alignment circuit 200 of the semiconductor memory apparatus can generate the first control signal group 'CTRL1A' to 'CTRL3A' and the second control signal group 'CTRL1B' to 'CTRL3B' using a relatively simple configuration. As such, the data alignment circuit 200 is suitable for high-speed operation. Further, the data alignment circuit is responsive to the alignment type signal 'ALT' thus allowing the state of the second control signal group 'CTRL1B' to 'CTRL3B' to be changed.

Figure 3:
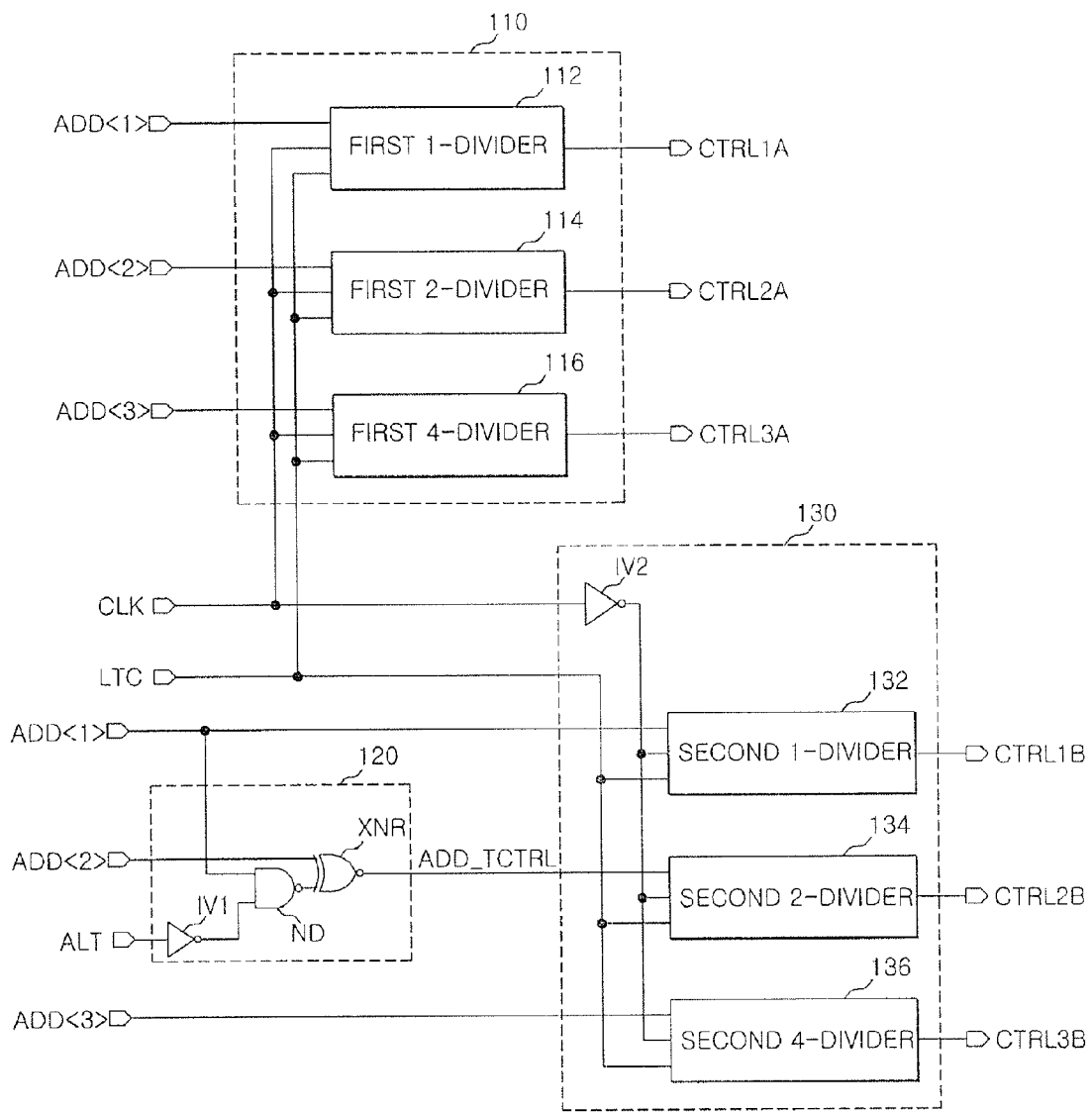
FIG. 3 is a configuration diagram of an embodiment of the controller of FIG. 2.

FIG. 3 is a configuration diagram of an embodiment of the controller of FIG. 2.

The embodiment of the controller 10 shown in FIG. 3 includes a first control unit 110, a type control unit 120, and a second control unit 130.

The first control unit 110 generates the first control signal group 'CTRL1A' to 'CTRL3A' in response to the address group 'ADD<1:3>', the clock signal 'CLK', and the latency signal 'LTC'. The type control unit 120 generates a type control address 'ADD_TCTRL' by combining the first address 'ADD<1>' and the second address 'ADD<2>' of the address group 'ADD<1:3>' with the alignment type signal 'ALT'. The second control unit 130 generates the second control signal group 'CTRL1B' to 'CTRL3B' in response to the clock signal 'CLK' and the latency signal 'LTC', the first address 'ADD<1>' of the address group 'ADD<1:3>', the third address 'ADD<3>', and the type control address 'ADD_TCTRL'.

As described above, in an embodiment of the present invention the address group 'ADD<1:3>' includes the first address 'ADD<1>', the second address 'ADD<2>' and the third address 'ADD<3>'. For the purpose of explanation, the control signals derived from the respective addresses of the address group 'ADD<1:3>' and constituting the first control signal group 'CTRL1A' to 'CTRL3A' will be referred to as the 1-1-th control signal 'CTRL1A', the 1-2-th control signal 'CTRL2A', and the 1-3-th control signal 'CTRL3A'. Further, the control signals derived from the respective addresses of the address group 'ADD<1:3>' and constituting the second control signal group 'CTRL1B' to 'CTRL3B' we be referred to as the 2-1-th control signal 'CTRL1B', the 2-2-th control signal 'CTRL2B', and the 2-3-th control signal 'CTRL3B'.

An embodiment of the first control unit 110 includes a first 1-divider 112, a first 2-divider 114, and a first 4-divider 116.

In response to the latency 'LTC' signal, the first 1-divider 112 divides the clock signal 'CLK' by 1 and generates the 1-1-th control signal 'CTRL1A' by latching the first address 'ADD<1>', whereby the enable interval of the 1-1-th control signal 'CTRL1A' is 1 clock cycle. In response to the latency 'LTC' signal, the first 2-divider 114 divides the clock signal 'CLK' by 2 and generates the 1-2-th control signal 'CTRL2A' by latching the second address 'ADD<2>', whereby the enable interval of the 1-2-th control signal 'CTRL2A' is 2 clock cycles. In response to the latency signal 'LTC', the first 4-divider 116 divides the clock signal 'CLK' by 4 and generates the 1-3-th control signal 'CTRL3A' by latching the third address 'ADD<3>', whereby the enable interval of the 1-3-th control signal 'CTRL3A' is 4 clock cycles.

An embodiment of the type control unit 120 includes a first inverter IV1, a NAND gate ND, and an exclusive NOR gate XNR.

The first inverter IV1 receives the alignment type signal 'ALT'. The NAND gate ND receives an output signal of the first inverter IV1 and the first address 'ADD<1>'. The exclusive NOR gate 'XNR' outputs the type control address 'ADD_TCTRL' by performing a NOR logical operation on the output signal of the NAND gate ND and the second address 'ADD<2>'.

An embodiment of the second control unit 130 includes a second inverter IV2, a second 1-divider 132, a second 2-divider 134, and a second 4-divider 136.

The second inverter IV2 receives and inverts the clock signal 'CLK'. In response to the latency signal 'LTC', the second 1-divider 132 divides the clock signal 'CLK' outputted from the second inverter IV2 by 1 and generates the 2-1-th control signal 'CTRL1B' by latching the first address 'ADD<1>', whereby the enable interval of the 2-1-th control signal 'CTRL1B' is 1 clock cycle. In response to the latency signal 'LTC', the second 2-divider 134 divides the clock signal outputted from the second inverter IV2 by 2 and generates the 2-2-th control signal 'CTRL2B' by latching the type control address 'ADD_TCTRL' whereby the enable interval of the 2-2-th control signal 'CTRL2B' is 2 clock cycles. In response to the latency signal 'LTC', the second 4-divider 136 divides the clock signal outputted from the second inverter IV2 by 4 and generates the 2-3-th control signal 'CTRL3B' by latching the third address 'ADD<3>', whereby the enable interval of the 2-3-th control signal 'CTRL3B' is 4 clock cycles.

Accordingly, the first control unit 110 outputs the first address 'ADD<1>' as the 1-1-th control signal 'CTRL1A' for one cycle of the clock signal 'CLK', outputs the second address 'ADD<2>' as the 1-2-th control signal 'CTRL2A' for two cycles of the clock signal 'CLK', and outputs the third address 'ADD<3>' as the 1-3-th control signal 'CTRL3A' for four cycles of the clock signal 'CLK'.

The value of the type control address 'ADD_TCTRL' output by the type control unit 120 differs depending on the state of the alignment type signal 'ALT'. For example, in the case in which the alignment type signal 'ALT' has a low voltage level, the generated type control address 'ADD_TCTRL' will have a low voltage level when the logical values of the first address 'ADD<1>' and the second address 'ADD<2>' are the same, and will have a high voltage level when the logical values of the first address 'ADD<1>' and the second address 'ADD<2>' are different. Conversely, when the alignment type signal 'ALT' has a high voltage level, the generated type control address 'ADD_TCTRL' will have the same logical value as the second address 'ADD<2>'.

The operation of the second control unit 130 is similar to that of the first control unit 110. That is, the second control unit 130 outputs the first address 'ADD<1>' as the 2-1-th control signal 'CTRL1B' for one cycle of the clock signal 'CLK', outputs the type control address 'ADD_TCTRL' as the 2-2-th control signal 'CTRL2B' for two cycles of the clock signal 'CLK', and outputs the third address 'ADD<3>' as the 2-3-th control signal 'CTRL3B' for four cycles of the clock signal 'CLK'. As shown in FIG. 3, the clock signal passes through the second inverter IV2 of the second control unit 130 and is thereby inverted, and thus the second control unit 130 uses a clock signal having a phase opposite to the clock signal 'CLK'. This allows for a timing difference of a half cycle of the clock signal to exist between the first control signal group 'CTRL1A' to 'CTRL3A' and the second control signal group 'CTRL1B' to 'CTRL3B'.

As such, the controller 10 divides the clock signal 'CLK' by 1, 2, and 4. The controller latches each address using the clock signals divided by 1, 2, and 4 to generate the first control signal group 'CTRL1A' to 'CTRL3A' and the second control signal group 'CTRL1B' to 'CTRL3B'. Thereafter, the first control signal group 'CTRL1A' to 'CTRL3A' and the second control signal group 'CTRL1B' to 'CTRL3B' are used in 2:1-multiplexing the data. By this configuration, lengths of enable intervals of the control signals are different, and therefore the number of data bits which the signals can pass varies according to the enablement interval of the respective control signals.

Figure 4A:
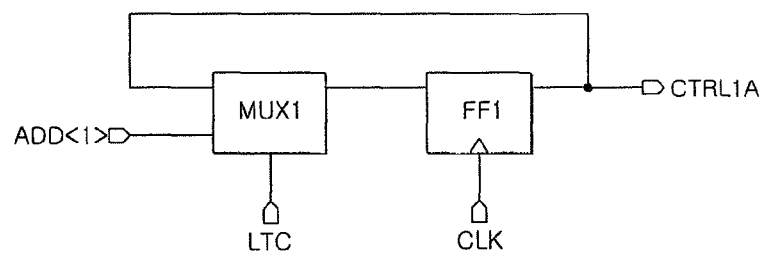
FIG. 4A is a configuration diagram of an embodiment of the first 1-divider of FIG. 3.

FIG. 4A is a configuration diagram of an embodiment of the first 1-divider of FIG. 3. Since the first 1-divider 112 and the second 1-divider 132 may have the same configuration, only the first 1-divider 112 is illustrated for brevity.

The embodiment of the first 1-divider 112 shown in FIG. 4A includes a first multiplexer MUX1 and a first flip-flop FF1.

The first multiplexer MUX1 selectively passes the first address 'ADD<1>' or the 1-1-th control signal 'CTRL1A' in response to the latency signal 'LTC'. The first flip-flop FF1 latches the output signal of the first multiplexer MUX1 and provides, as an output, the 1-1-th control signal 'CTRL1A' in response to the clock signal 'CLK'.

The configuration of the first 1-divider 112 shown in FIG. 4A allows the first address 'ADD<1>' to be outputted as the 1-1-th control signal 'CTRL1A' for one cycle of the clock signal 'CLK'.

Figure 4B:
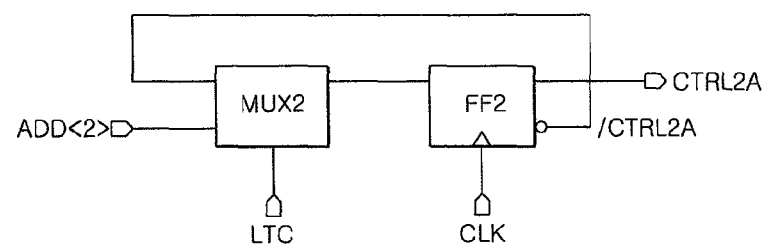
FIG. 4B is a configuration diagram of an embodiment of the first 2-divider of FIG. 3.

FIG. 4B is a configuration diagram of an embodiment of the first 2-divider of FIG. 3. Since the first 2-divider 114 and the second 2-divider 134 may have the same configuration, only the first 2-divider 114 is illustrated for brevity.

The embodiment of the first 2-divider 114 shown in FIG. 4B includes a second multiplexer MUX2 and a second flip-flop FF2.

The second multiplexer MUX2 selectively passes the second address 'ADD<2>' or an inverted 1-2-th control signal '/CTRL2A' in response to the latency signal 'LTC'. The second flip-flop FF2 latches an output signal of the second multiplexer MUX2 and provides, as an output, the 1-2-th control signal 'CTRL2A' in response to the clock signal 'CLK'.

This configuration allows the second address 'ADD<2>' to be outputted as the 1-2-th control signal 'CTRL2A' for two cycles of the clock signal 'CLK'.

Figure 4C:
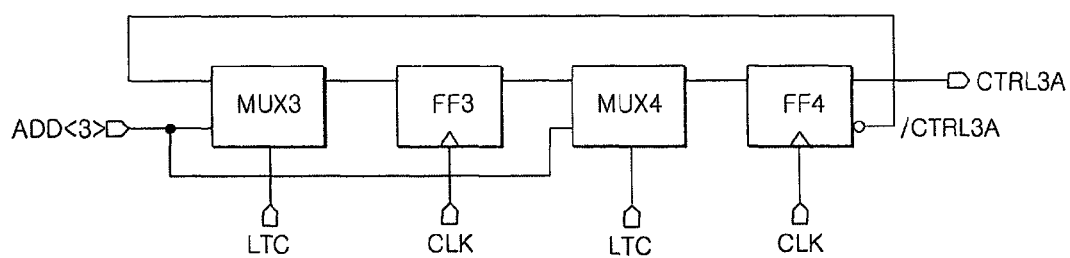
FIG. 4C is a configuration diagram of an embodiment of the first 4-divider of FIG. 3.

FIG. 4C is a configuration diagram of an embodiment of the first 4-divider of FIG. 3. Since the first 4-divider 116 and the second 4-divider 136 may have the same configuration, only the first 4-divider 116 is illustrated for brevity.

The embodiment of the first 4-divider 116 shown in FIG. 4C includes a third multiplexer MUX3, a third flip-flop FF3, a fourth multiplexer MUX4, and a fourth flip-flop F4.

The third multiplexer MUX3 selectively passes the third address 'ADD<3>' or an inverted 1-3-th control signal '/CTRL3A' in response to the latency signal 'LTC'. The third flip-flop FF3 latches the output signal of the third multiplexer MUX3 in response to the clock signal 'CLK'. The fourth multiplexer MUX4 selectively passes the third address 'ADD<3>' or the output signal of the third flip-flop FF3 in response to the latency signal 'LTC'. The fourth flip-flop FF4 latches the output signal of the fourth multiplexer MUX4 and outputs the 1-3-th control signal 'CTRL3A' in response to the clock signal 'CLK'.

This configuration allows the third address 'ADD<3>' to be outputted as the 1-3-th control signal 'CTRL3A' for four cycles of the clock signal 'CLK'.

Figure 5:
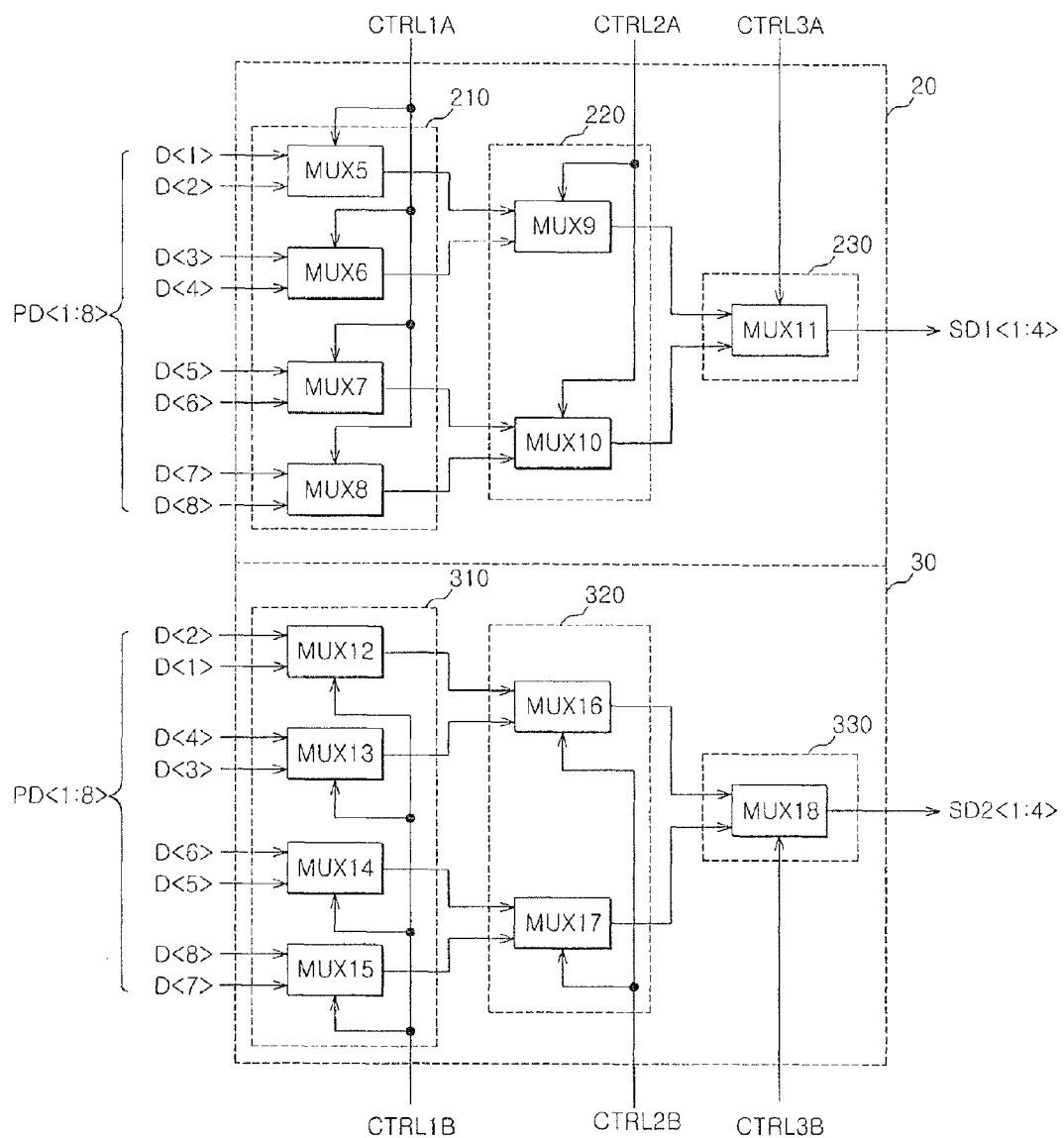
FIG. 5 is a configuration diagram of an embodiment of the first alignment unit of FIG. 2.

FIG. 5 is a configuration diagram showing an embodiment of the first alignment unit and the second alignment unit of FIG. 2.

The embodiment of the first and second alignment units shown in FIG. 5 includes first to third multiplexing units 210 to 230.

The first multiplexing unit 210 performs 2:1-multiplexing on the parallel data group 'PD<1:8>' in response to the 1-1-th control signal 'CTRL1A'. The second multiplexing unit 220 performs 2:1-multiplexing on the data group outputted from the first multiplexing unit 210 in response to the 1-2-th control signal 'CTRL2A'. The third multiplexing unit 230 performs 2:1-multiplexing on the data group outputted from the second multiplexing unit 220 in response to the 1-3-th control signal 'CTRL3A' to output the first serial data group 'SD1<1:4>'.

In the embodiment shown in FIG. 5, the first multiplexing unit 210 includes four multiplexers MUX5 to MUX8. The second multiplexing unit 220 includes two multiplexers MUX9 and MUX10. The third multiplexing unit 230 includes one multiplexer MUX11.

The embodiment of the second alignment unit 30 shown in FIG. 5 includes fourth to sixth multiplexing units 310 to 330.

The fourth multiplexing unit 310 performs 2:1-multiplexing on the parallel data group 'PD<1:8>' in response to the 2-1-th control signal 'CTRL1B'. The fifth multiplexing unit 320 performs 2:1-multiplexing on the data group outputted from the fourth multiplexing unit 310 in response to the 2-2-th control signal 'CTRL2B'. The sixth multiplexing unit 330 performs 2:1-multiplexing on the data group outputted from the fifth multiplexing unit 320 in response to the 2-3-th control signal 'CTRL3B' to output the second serial data group 'SD2<1:4>'.

In the embodiment shown in FIG. 5, the fourth multiplexing unit 310 includes four multiplexers MUX12 to MUX15. The fifth multiplexing unit 320 includes two multiplexers MUX16 and MUX17. The third multiplexing unit 330 includes one multiplexer MUX18.

Although not shown, the data combination unit 40 is preferably configured to include one multiplexer.

By the configurations of the first alignment unit 20 and the second alignment unit 30, the parallel data group 'PD<1:8>' is aligned as the first serial data group 'SD1<1:4>' and the second serial data group 'SD2<1:4>'. Thereafter, the parallel data group 'PD<1:8>' is aligned as the third serial data group 'SD3<1:8>' by the data combination unit 40.

An example in which the address group 'ADD<1:3>' has a logical value of (1, 0, 0) and the alignment type signal 'ALT' has a logical value of '0' will now be described. The type control address 'ADD_TCTRL' generated by the type control unit 120 will have a logical value of '1'. At this time, the ADD<1> having a logic value of 1 is output as the 1-1-th control signal CTRL1A and the 2-1 control signal CTRL1B for one cycle of the clock signal 'CLK'. Therefore, the first multiplexing unit 210 outputs parallel data of 'D<2>', 'D<4>', 'D<6>', and 'D<8>' and the fourth multiplexing unit 310 outputs parallel data of 'D<3>', 'D<1>', 'D<7>', and 'D<5>'. In addition, ADD<2> having a logic value of 0 is output as the 1-2-th control signal 'CTRL2A' for two cycles of the clock signal 'CLK', and alignment type signal 'ALT' is output as the 2-2-th control signal 'CTRL2B' for two cycles of the clock signal 'CLK'. Therefore, the second multiplexing unit 220 outputs serial data of 'D<2>' and 'D<4>' and serial data of 'D<6>' and 'D<8>'; and the fifth multiplexing unit 320 outputs serial data of 'D<3>' and 'D<1>' and serial data of 'D<7>' and 'D<5>'. In addition, ADD<3> having a logic value of 0 is output as the 1-3-th control signal 'CTRL3A' and the 2-3-th control signal 'CTRL3B' for four cycles of the clock signal 'CLK'. Therefore, the third multiplexing unit 230 outputs the serial data of 'D<2>', 'D<4>', 'D<6>', and 'D<8>' as the first serial data group 'SD1<1:4>'; and the sixth multiplexing unit 330 outputs the serial data of 'D<3>', 'D<1>', 'D<7>', and 'D<5>' as the second serial data group 'SD2<1:4>'. The data combination unit 40 outputs a third serial data group of 'D<2>', 'D<3>' 'D<4>', 'D<1>', 'D<6>', 'D<7>', 'D<8>', and 'D<5>' as the third serial data group 'SD3<1:8>' by combining the second serial data group 'SD2<1:4>' with the first serial data group 'SD1<1:4>'.

Further, in a case in which the address group above is input, but the alignment type signal 'ALT' has a logical value of '1', the type control address 'ADD_TCTRL' will have a logical value of '0'. At this time, the first multiplexing unit 210 outputs parallel data of 'D<2>', 'D<4>', 'D<6>', and 'D<8>' and the fourth multiplexing unit 310 outputs parallel data of 'D<1>', 'D<3>', 'D<5>', and 'D<7>'. In addition, the second multiplexing unit 220 outputs serial data of 'D<2>' and 'D<4>' and serial data of 'D<6>' and 'D<8>'. However, the fifth multiplexing unit 320 now outputs serial data of 'D<1>' and 'D<3>' and serial data of 'D<5>' and 'D<7>'. As can be seen, the order of the data has been modified as a result of the change in logic value of the alignment type signal 'ALT'. Thereafter, the third multiplexing unit 230 outputs the serial data of 'D<2>', 'D<4>', 'D<6>', and 'D<8>' as the first serial data group 'SD1<1:4>', and the sixth multiplexing unit 330 outputs the serial data of 'D<1>', 'D<3>', 'D<5>', and 'D<7>' as the second serial data group 'SD2<1:4>'. The data combination unit 40 can output a third serial data group of 'D<2>', 'D<1>' 'D<4>', 'D<3>', 'D<6>', 'D<5>', 'D<8>', and 'D<7>' as the third serial data group 'SD3<1:8>' by combining the second serial data group 'SD2<1:4>' with the first serial data group 'SD1<1:4>'.

Further variations in the combination order of the third serial data group 'SD3<1:8>', which can be altered in accordance with the logical value of the address group 'ADD<1: 3>' and the logical value of the alignment type signal 'ALT', will be easily appreciated with reference to the following table. The following table shows the logical values of the address group 'ADD<1:3>' and data alignment orders by types defined by the alignment type signal 'ALT'. The expression 'D' accompanying the data bit is omitted in the table.

TABLE

| ADD <3> | ADD <2> | ADD <1> | | | | ALT '0' | | | | | | | | ALT '1' | | | | |
|---|---|---|---|---|---|---|---|---|---|---|---|---|---|---|---|---|---|---|
| 0 | 0 | 0 | 1 | 2 | 3 | 4 | 5 | 6 | 7 | 8 | 1 | 2 | 3 | 4 | 5 | 6 | 7 | 8 |
| 0 | 0 | 1 | 2 | 3 | 4 | 1 | 6 | 7 | 8 | 5 | 2 | 1 | 4 | 3 | 6 | 5 | 8 | 7 |
| 0 | 1 | 0 | 3 | 4 | 1 | 2 | 7 | 8 | 5 | 6 | 3 | 4 | 1 | 2 | 7 | 8 | 5 | 6 |
| 0 | 1 | 1 | 4 | 1 | 2 | 3 | 8 | 5 | 6 | 7 | 4 | 3 | 2 | 1 | 8 | 7 | 6 | 5 |
| 1 | 0 | 0 | 5 | 6 | 7 | 8 | 1 | 2 | 3 | 4 | 5 | 6 | 7 | 8 | 1 | 2 | 3 | 4 |
| 1 | 0 | 1 | 6 | 7 | 8 | 5 | 2 | 3 | 4 | 1 | 6 | 5 | 8 | 7 | 2 | 1 | 4 | 3 |
| 1 | 1 | 0 | 7 | 8 | 5 | 6 | 3 | 4 | 1 | 2 | 7 | 8 | 5 | 6 | 3 | 4 | 1 | 2 |
| 1 | 1 | 1 | 8 | 5 | 6 | 7 | 4 | 1 | 2 | 3 | 8 | 7 | 6 | 5 | 4 | 3 | 2 | 1 |

Accordingly, since the data alignment circuit 200 of the semiconductor memory apparatus can generate the first control signal group 'CTRL1A' to 'CTRL3A' and the second control signal group 'CTRL1B' to 'CTRL3B' to correspond to the logical value of the address group 'ADD<1:3>', and the outputted third serial data group 'SD3<1:8>' can be adjusted by using the first control signal group 'CTRL1A' to 'CTRL3A' and the second control signal group 'CTRL1B' to 'CTRL3B' generated according to the address group 'ADD<1:3>'. In addition, the alignment types of the data can be further adjusted in accordance with the logical value of the alignment type signal 'ALT' by using a simple circuit configuration.

As described above, the data alignment circuit 200 of the semiconductor memory apparatus generates the control signal groups and uses 2:1 multiplexers that are responsive to the control signal groups to align the parallel data as serial data. This is a remarkably simplified configuration when compared to known circuit configurations. Therefore, the semiconductor memory apparatus with the data alignment circuit can be more easily be adopted for high-speed operation. Further, embodiments of the present invention provide a circuit configuration that can change the alignment type of the data in response to the alignment type signal, allowing a plurality of data types to be defined with a simple circuit configuration.

While certain embodiments have been described above, it will be understood that the embodiments described are by way of example only. Accordingly, the device and the method described herein should not be limited based on the described embodiments. Rather, the devices and methods described herein should only be limited in light of the claims that follow when taken in conjunction with the above description and accompanying drawings.

What is claimed is:

1. A data alignment circuit of a semiconductor memory apparatus for receiving and aligning parallel data group, the data alignment circuit comprising:

a first control unit configured to generate a first control signal group in response to an address group, a clock signal, and a latency signal;

a second control unit configured to generate a second control signal group in response to the address group, the clock signal, and the latency signal;

a first alignment unit configured to align the parallel data group in response to the first control signal group so as to generate a first serial data group; and a second alignment unit configured to align the parallel data group in response to the second control signal group so as to generate a second serial data group.

2. The data alignment circuit of claim 1, wherein in response to the latency signal, the first control unit is configured to divide the clock signal by 1, by 2, and by 4; and to latch addresses of the address group using the divided clock signals in order to generate the first control signal group.

3. The data alignment circuit of claim 1, wherein the second control unit is configured to modify a state of the second control signal group depending upon a logic value of an alignment type signal so as to control an order of the second serial data group.

4. The data alignment circuit of claim 3, wherein the address group includes a first address, a second address, and a third address, and the second control unit is configured to be responsive to the latency signal so as to generate a first control signal by dividing the clock signal by 1 and latching the first address; generate a second control signal by dividing the clock signal by 2 and latching a signal generated by combining the first address, the second address, and the alignment type signal; generate a third control signal by dividing the clock signal by 4 and latching the third address, wherein the second control unit outputs the first to third control signals as the second control signal group.

5. The data alignment circuit of claim 1, wherein the first alignment unit is configured to perform 2:1-multiplexing on the parallel data group in response to the first control signal group at plural times to generate the first serial data group.

6. The data alignment circuit of claim 1, wherein the second alignment unit is configured to perform 2:1-multiplexing on the parallel data group in response to the second control signal group at plural times to generate the second serial data group.

7. The data alignment circuit of claim 1, further comprising:

a data combination unit configured to output a third serial data group by combining the second serial data group with the first serial data group in response to the clock signal.

8. The data alignment circuit of claim 1, wherein the controller further comprises:

a first control unit configured to generate the first control signal group such that each control signal of the first control signal group has a different enable interval;

a type control unit responsive to a type control signal to generate a type control address;

a second control unit configured to generate the second control signal group such that each control signal of the second control signal group has a different enable interval, wherein the second control signal group is modified according to the type control address.

9. The data alignment circuit of claim 8, wherein the first and second alignment units each comprise:

a plurality of multiplexing units, the first multiplexing unit of the plurality of multiplexing units receiving the parallel data group and each remaining multiplexing unit of the plurality of multiplexing units receiving an output of a previous multiplexing unit, wherein each of the plurality of multiplexing units is responsive to a corresponding control signal of the first or second control signal group.

10. A data alignment circuit of a semiconductor memory appartus, comprising:

a controller configured to generate a first control signal group and a second control signal group in response to an address group, a clock signal, and a latency signal, wherein the controller is configured to change a state of the second control signal group in response to an alignment type signal;

a first alignment unit configured to align a parallel data group as a first serial data group in response to the first control signal group;

a second alignment unit configured to align the parallel data group as a second serial data group in response to the second control signal group; and a data combination unit configured to output a third serial data group by combining the second serial data group and the first serial data group in response to the clock signal.

11. The data alignment circuit of claim 10, wherein the controller comprises:

a first controller configured to generate the first control signal group in response to the address group, the clock signal, and the latency signal;

a type controller configured to generate a type control address by combining addresses included in the address group with the alignment type signal; and a second controller configured to generate the second control signal group in response to the clock signal, the latency signal, addresses included in the address group, and the type control address.

12. The data alignment circuit of claim 11, wherein in response to the latency signal, the first controller is configured to generate the first control signal group by dividing the clock signal by 1, by 2, and by 4 and latching each address of the address group using the divided clock signals.

13. The data alignment circuit of claim 11, wherein in response to the latency signal, the second controller is configured to generate the second control signal group by dividing the clock signal by 1, by 2, and by 4 and latching each address of the address group and the type control address using the divided clock signals.

14. The data alignment circuit of claim 10, wherein the first alignment unit is configured to generate the first serial data group by performing 2:1-multiplexing on the parallel data group in response to the first control signal group at plural times.

15. The data alignment circuit of claim 10, wherein the second alignment unit is configured to generate the second serial data group by performing 2:1-multiplexing on the parallel data group in response to the second control signal group at plural times.

16. The data alignment circuit of claim 10, wherein the data combination unit is configured to output the third serial data group by alternately extracting bits of the first serial data group and the second serial data group.

17. A data alignment circuit of a semiconductor memory apparatus for receiving and aligning parallel data group to output an aligned serial data group, the data alignment circuit comprising:

a controller responsive to an address group, the controller being configured to generate a first control signal group derived from the address group and a second control signal group derived from the address group, wherein the address group controls an order of the aligned serial data group;

a first alignment unit configured to align the parallel data group in response to the first control group so as to generate a first serial data group a second alignment unit configured to align the parallel data group in response to the second control signal group so as to generate a second serial data group a data combination unit combining the first and second serial data groups to output the aligned serial data group.

* * * * *